(12) United States Patent
Kang et al.

(10) Patent No.: US 8,243,530 B2
(45) Date of Patent: Aug. 14, 2012

(54) NON-VOLATILE MEMORY DEVICE

(75) Inventors: Sang-Gu Kang, Suwon-si (KR);
  Hee-Won Lee, Seoul (KR); Ju-Seok Lee, Jeongeup-si (KR); Jung-Ho Song, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 234 days.

(21) Appl. No.: 12/713,219

(22) Filed: Feb. 26, 2010

(65) Prior Publication Data

US 2010/0220535 A1 Sep. 2, 2010

(30) Foreign Application Priority Data

Feb. 27, 2009 (KR) ........................ 10-2009-0016763

(51) Int. Cl.
  *G11C 5/14* (2006.01)
  *G11C 7/00* (2006.01)

(52) U.S. Cl. ............... 365/189.09; 365/203; 365/185.12; 365/185.21

(58) Field of Classification Search ............. 365/189.09, 365/203, 185.12, 185.21
  See application file for complete search history.

(56) References Cited

U.S. PATENT DOCUMENTS 7,082,069 B2 * 7/2006 Chou et al. .................... 365/203
2006/0023531 A1 * 2/2006 Crippa et al. ................. 365/203

FOREIGN PATENT DOCUMENTS

| JP | 08-096582 | 4/1996 |
| JP | 2004-199813 | 7/2004 |
| JP | 2005-190626 | 7/2005 |

* cited by examiner

*Primary Examiner* — Alexander Sofocleous
*Assistant Examiner* — Hai Pham
(74) *Attorney, Agent, or Firm* — Volentine & Whitt, PLLC

(57) ABSTRACT

A non-volatile memory device includes a feedback circuit and a precharge switching transistor. The feedback circuit generates a feedback signal based on a voltage level of a bitline during a precharge operation. The precharge switching transistor, in response to the feedback signal, controls a precharge current for precharging the bitline. The speed of the precharge operation may be increased and/or mismatch of the bias signals in precharging a plurality of bitlines may be reduced.

7 Claims, 9 Drawing Sheets

NON-VOLATILE MEMORY DEVICE

CROSS-REFERENCE TO RELATED APPLICATION(S)

A claim of priority under 35 USC §119 is made to Korean Patent Application No. 2009-0016763, filed on Feb. 27, 2009, in the Korean Intellectual Property Office (KIPO), the contents of which are incorporated herein in its entirety by reference.

BACKGROUND

Example embodiments relate to non-volatile memory devices, and more particularly to non-volatile memory devices configured to enhance the speed and reliability of a precharge operation.

A non-volatile memory device stores data into a memory cell by performing a programming operation, and reads out the stored data by performing a read operation. During the read operation, the bitline is precharged before the charge corresponding to the stored data is developed to the bitline, and then the developed bitline voltage is sensed. In other words, the read operation generally includes a precharge operation which is followed by a sensing operation. In the precharge operation, the bitline is charged to a predetermined voltage level. In the sense operation, the bitline voltage is developed (e.g., decreased or increased) according to the stored data, and then the developed bitline voltage is sensed to determine the data stored in the memory cell. The precharge time may be a significant component of the entire read operation time, and thus the operation speed of the non-volatile memory device may be degraded as the precharge time increases.

SUMMARY

Some example embodiments provide a non-volatile memory device capable of enhancing speed and reliability of a precharge operation.

According to example embodiments, a non-volatile memory device includes a feedback circuit and a precharge switching transistor. The feedback circuit generates a feedback signal based on a voltage level of a bitline during a precharge operation. The precharge switching transistor, in response to the feedback signal, controls a precharge current for precharging the bitline.

The feedback circuit may include an active circuit configured to be driven based on a bias signal to generate the feedback signal based on the voltage level of the bitline.

The non-volatile memory device may further include a bias signal generator configured to be charged using the precharge current to provide the bias signal to the feedback circuit. The bias signal may be a bias current signal.

The bias signal generator may generate the bias signal during at least one of the precharge operation and a dummy-precharge operation. The bias signal generator may be disposed adjacent to the feedback circuit.

The bias signal generator may include a charging unit and a switch unit. The charging unit may be charged using the precharge current to generate a bias voltage signal, and may generate a bias current signal based on the bias voltage signal. The switch unit may control a current path between the charging unit and the bitline.

The switch unit may electrically connect the bitline and the charging unit to charge the charging unit, and may electrically disconnect the bitline from the charging unit when the charging unit is charged to a target level of the bias voltage signal for generating the bias current signal.

In an embodiment, the feedback circuit may include an amplifier configured to be driven based on a bias current signal to generate the feedback signal by amplifying a difference between a precharge level signal and the voltage level of the bitline.

In another embodiment, the feedback circuit may include a feedback transistor configured to be driven based on a bias current signal to generate the feedback signal in response to the voltage level of the bitline.

In still another embodiment, the feedback circuit may include a differential amplifier configured to be driven based on a bias current signal to generate the feedback signal by comparing a precharge level signal and the voltage level of the bitline.

According to example embodiments, a non-volatile memory device includes a page buffer circuit, a plurality of feedback circuits and a bias signal generator. The page buffer circuit includes a plurality of precharge switching transistors coupled between a plurality of bitlines and a plurality of sense amplifiers, respectively. The precharge switching transistors, in response to feedback signals, control precharge currents for precharging the bitlines, respectively. The feedback circuits are driven based on bias signals to generate the feedback signals based on voltage levels of the bitlines, respectively, during a precharge operation. The bias signal generator is charged using the precharge currents to provide the bias signals to the feedback circuits, respectively.

The bias signal generator may include at least one shared circuit block and a plurality of unshared circuit blocks. Each shared circuit block is coupled to two or more of the feedback circuits, and each unshared circuit block is coupled to and disposed adjacent to each of the feedback circuits.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
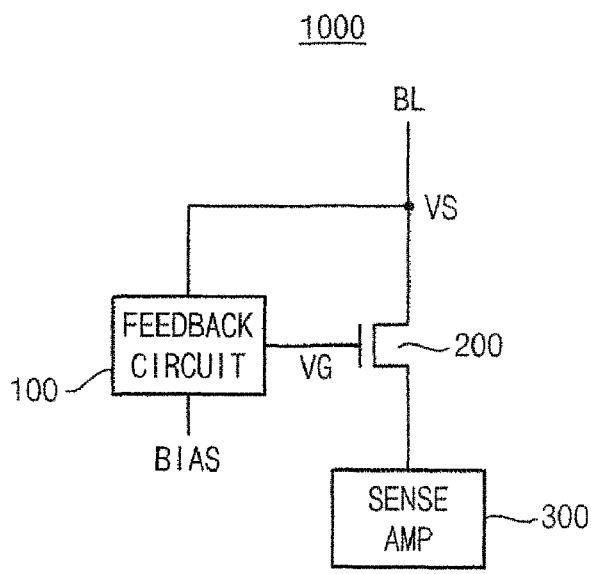
FIG. 1 is a block diagram illustrating a non-volatile memory device according to example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a non-volatile memory device according to example embodiments.

Referring to FIG. 1, a non-volatile memory device 1000 includes a feedback circuit 100 and a precharge switching transistor 200. The feedback circuit 100 generates a feedback signal VG based on a voltage level VS of a bitline BL during a precharge operation. The precharge switching transistor 200, in response to the feedback signal VG, controls a precharge current for precharging the bitline BL. The bitline BL may be electrically coupled to a sense amplifier 300 through the precharge switching transistor 200. The precharge current for precharging the bitline BL may be provided by the sense amplifier 300. The feedback circuit may be driven based on a bias signal BIAS, which may be a current signal or a voltage signal.

Figure 2A:
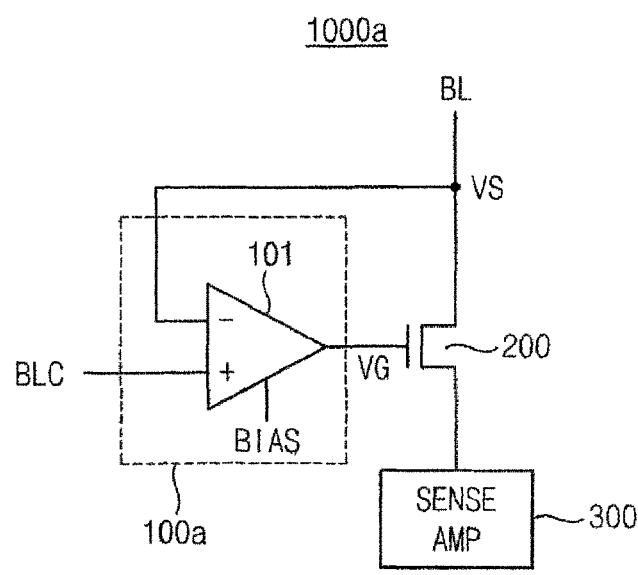
FIGS. 2A, 2B and 2C are diagrams illustrating examples of the non-volatile memory device of FIG. 1.

FIG. 2A is a diagram illustrating an example of the non-volatile memory device of FIG. 1.

Referring to FIG. 2A, a non-volatile memory device 1000a includes a feedback circuit 100a and a precharge switching transistor 200. The feedback circuit 100a of this example includes an active circuit 101 that is driven based on a bias signal BIAS, which may be a bias current signal or a bias voltage signal. The active circuit 101 generates a feedback signal VG based on a voltage level VS of a bitline BL during a precharge operation. For example, the active circuit 101 may be an amplifier that is driven based on the bias current signal BIAS to generate the feedback signal VG by amplifying a difference between a precharge level signal BLC and the voltage level VS of the bitline BL. The feedback signal VG is applied to a gate of the precharge switching transistor 200.

The precharge switching transistor 200 is turned on or off according to a difference between a source voltage (that is, the bitline voltage VS) and a gate voltage (that is, the feedback signal VG). When precharge switching transistor 200 is turned on, the precharge current provided by the sense amplifier 300 can flow into the bitline BL and the bitline voltage or the source voltage VS increases gradually. When precharge switching transistor 200 is turned off, the precharge current is intercepted, and the bitline voltage VS is maintained. The level of the precharge current during the precharge operation may be varied according to the feedback signal VG and the bitline voltage VS.

The feedback signal VG is relatively high before the bitline BL is precharged, and thus the precharge current flowing through the precharge switching transistor 200 is relatively high. The voltage difference between the feedback signal VG and the bitline voltage VS decreases as the bitline BL is precharged, and thus the precharge current flowing through the precharge switching transistor 200 decreases. Since the feedback circuit generates the feedback signal VG by amplifying the voltage difference between the precharge level signal BLC and the bitline voltage VS, the initial level of the precharge current may be increased. As a result, the speed of the precharge operation may be increased through such amplification, compared with a case where the precharge level signal BLC is directly applied to the gate of the precharge switching transistor 200.

As illustrated in FIG. 2A, the finally-precharged bitline voltage VS may be controlled by adjusting the precharge level signal BLC. The bitline BL may be precharged to a relatively high voltage level if the precharge level signal BLC is increased, and the bitline BL may be precharged to a relatively low voltage level if the precharge level signal BLC is decreased.

Figure 2B:
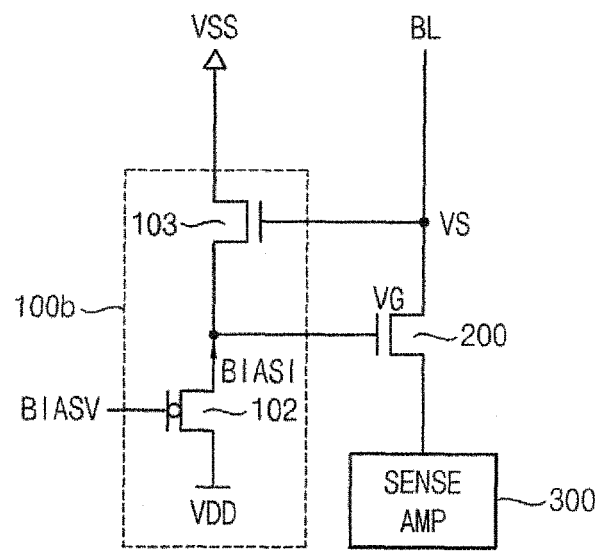

FIG. 2B is a diagram illustrating another example of the non-volatile memory device of FIG. 1.

Referring to FIG. 2B, a non-volatile memory device 1000b includes a feedback circuit 100b and a precharge switching transistor 200. The feedback circuit 100b of this example includes a bias current source 102 and a feedback transistor 103.

The bias current source 102 generates a bias current signal BIASI for driving the feedback transistor 103. For example, the bias current source 102 may be a transistor operating in response to a bias voltage signal provided from an external device such as a memory controller. The transistor 102 may be a p-channel metal-oxide semiconductor (PMOS) transistor coupled between a power supply voltage VDD and the feedback transistor 103, and the bias voltage signal may be applied to a gate of the transistor 102.

The feedback transistor 103 is driven based on the bias current signal BIASI to generate the feedback signal VG in response to the voltage level VS of the bitline. The feedback transistor 103 may be an n-channel metal-oxide semiconductor (NMOS) transistor coupled between a ground voltage VSS and the bias current source 102, and bitline voltage VS may be applied to a gate of the feedback transistor 103.

In the example of FIG. 2B, the bitline voltage VS is relatively low in an initial period of the precharge operation, and thus the feedback transistor 103 is turned off since the voltage difference between a source and a gate of the feedback transistor 103 is lower than a threshold voltage. Accordingly the feedback signal VG is relatively high, and thus precharge switching transistor 200 is turned on so that the precharge current may flow in the bitline BL. In this case, the feedback signal VG may be amplified since the feedback signal is generated by inverting the bitline voltage VS through the feedback transistor 103. As a result, the speed of the precharge operation may be increased through such amplification, compared with a case where a voltage of constant level such as the precharge level signal BLC is directly applied to the gate of the precharge switching transistor 200.

As the bitline BL is precharged, the bitline voltage VS increases sufficiently to turn on the feedback transistor 103. In this case, the feedback signal VG decreases sufficiently to turn off the precharge switching transistor 200, and thus the bitline voltage is maintained, which indicates that the precharge operation is completed. For example, the finally-prechaged bitline voltage VS may be controlled by adjusting a threshold voltage of the feedback transistor 103.

Figure 2C:
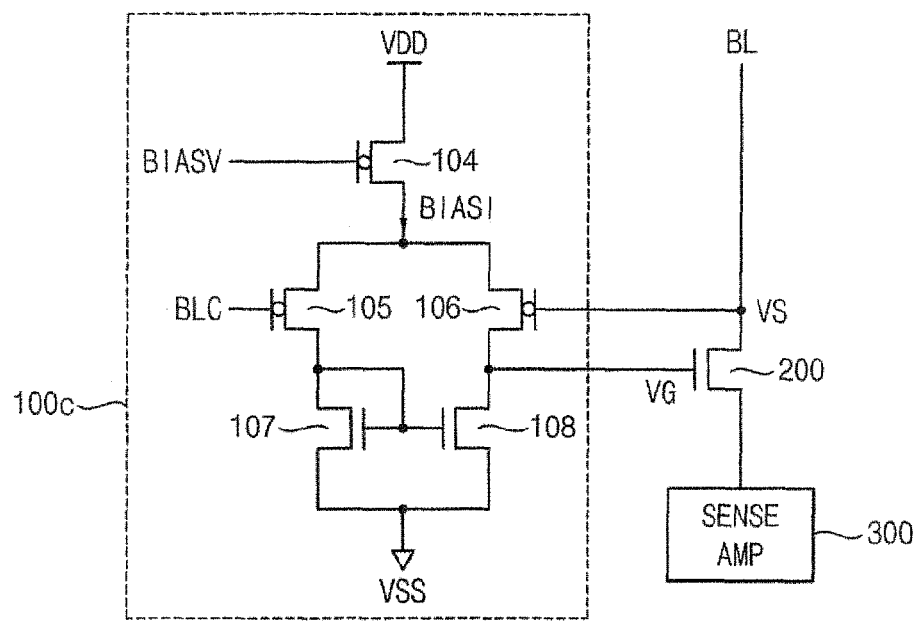

FIG. 2C is a diagram illustrating still another example of the non-volatile memory device of FIG. 1.

Referring to FIG. 2C, a non-volatile memory device 1000c includes a feedback circuit 100c and a precharge switching transistor 200. The feedback circuit 100c of this example includes a differential amplifier 100c that is driven based on a bias current signal BIASI to generate the feedback signal VG by comparing a precharge level signal BLC and the voltage level VS of the bitline BL.

The differential amplifier 100c may include a bias current source 104, a differential transistor pair 105 and 106, and an active load pair 107 and 108.

The bias current source 104 generates a bias current signal BIASI in response to a bias voltage signal BIASV for driving the differential transistor pair 105 and 106. The bias current source 104 may be a PMOS transistor coupled between a power supply voltage VDD and the differential transistor pair 105 and 106, and the bias voltage signal may be applied to a gate of the PMOS transistor 104.

The differential transistor pair 105 and 106 may be PMOS transistors coupled between the bias current source 104 and the active load pair 107 and 108. The PMOS transistors 105 and 106 may compare the precharge level signal BLC and the bitline voltage VS, and amplify the voltage difference between the precharge level signal BLC and the bitline voltage VS to generate the feedback signal VG. The feedback signal VG may be provided at one of drains of the PMOS transistors 105 and 106. The active load pair 107 and 108 may be coupled between a ground voltage VSS and the differential transistor pair 105 and 106.

The operation of the differential amplifier 100c of FIG. 2C is similar to that of the amplifier 100a of FIG. 2A. The differential amplifier 100c generates the feedback signal VG by amplifying the voltage difference between the precharge level signal BLC and the bitline voltage VS, and the precharge switching transistor 200 controls the precharge current depending on the voltage difference between a source voltage (that is, the bitline voltage VS) and a gate voltage (that is, the feedback signal VG). The feedback signal VG is relatively high before the bitline BL is precharged, and thus the precharge current flowing through the precharge switching transistor 200 is relatively high. The voltage difference between the precharge level signal BLC and the bitline voltage VS decreases as the bitline BL is precharged, and thus the precharge current flowing through the precharge switching transistor 200 decreases. Since the differential amplifier 100c generates the feedback signal VG by amplifying the voltage difference between the precharge level signal BLC and the bitline voltage VS, the initial level of the precharge current may be increased. As a result, the speed of the precharge operation may be increased through such amplification, compared with a case where the precharge level signal BLC is directly applied to the gate of the precharge switching transistor 200.

As illustrated in FIG. 2C, the finally-prechaged bitline voltage VS may be controlled by adjusting the precharge level signal BLC. The bitline BL may be precharged to a relatively high voltage level if the precharge level signal BLC is increased, and the bitline BL may be precharged to a relatively low voltage level if the precharge level signal BLC is decreased.

Figure 3A:
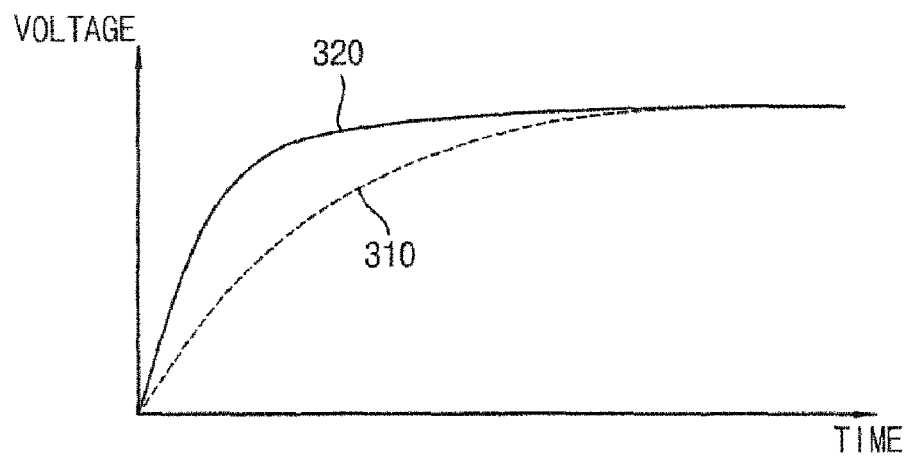
FIG. 3A is a diagram illustrating a voltage level of a bitline during a precharge operation.
Figure 3B:
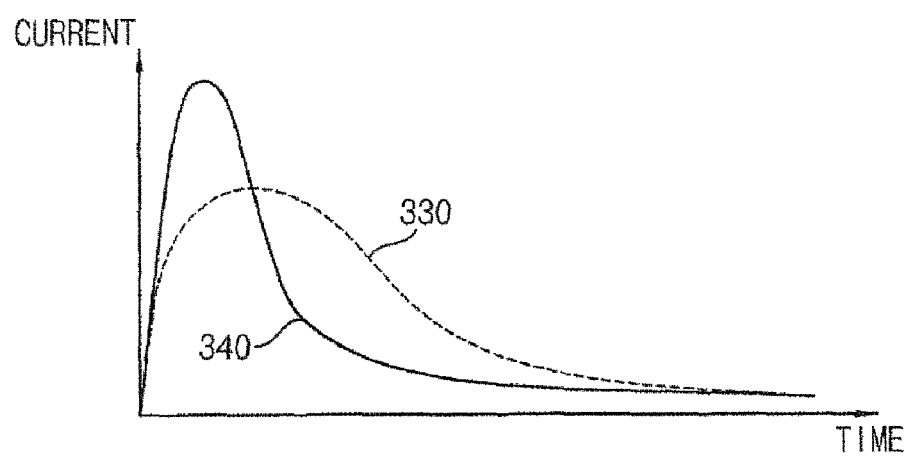
FIG. 3B is a diagram illustrating a current level of a bitline during a precharge operation.

FIG. 3A is a diagram illustrating a voltage level of a bitline during a precharge operation, and FIG. 3B is a diagram illustrating a current level of a bitline during a precharge operation.

Referring to FIG. 3A, the bitline voltage 320 of the non-volatile memory device according to example embodiments increases as a result of the precharge operation more rapidly than the bitline voltage 310 of the conventional non-volatile memory device.

Referring to FIG. 3B, the initial level of the precharge current 340 of the non-volatile memory device according to example embodiments is relatively high compared with the precharge current 330 of the conventional non-volatile memory device. As a result, the precharge current 340 of the non-volatile memory device according to example embodiments decreases more rapidly than the precharge current 330 of the conventional non-volatile memory device, which represents that the precharge operation is completed more rapidly than the conventional non-volatile memory device, and thus the speed of the precharge operation may be enhanced.

Figure 4:
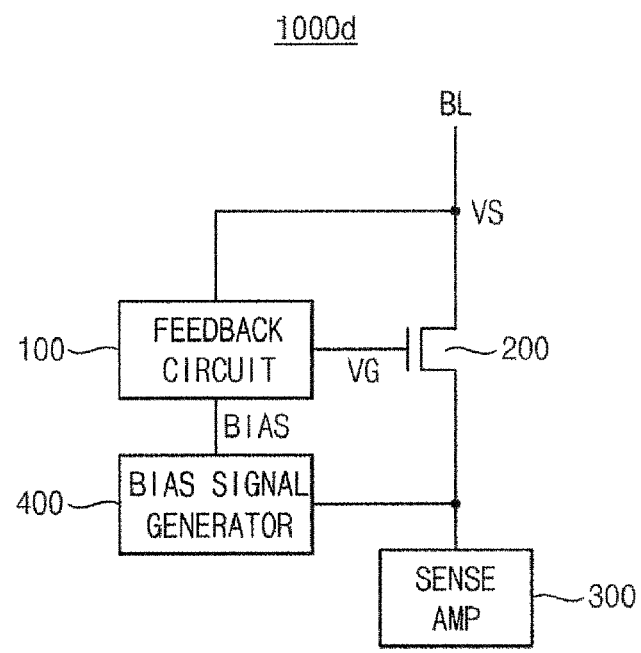
FIG. 4 is a block diagram illustrating a non-volatile memory device according to example embodiments.

FIG. 4 is a block diagram illustrating a non-volatile memory device according to example embodiments.

Referring to FIG. 4, a non-volatile memory device 1000d includes a feedback circuit 100, a precharge switching transistor 200 and a bias signal generator 400.

The feedback circuit 100 generates a feedback signal VG based on a voltage level VS of a bitline BL during a precharge operation. The feedback circuit 100 may include an active circuit that is driven based on a bias signal BIAS provided by the bias signal generator 400. The feedback circuit 100 may, for example, have a configuration similar to any of the feedback circuits 100a, 100b and 100c of FIGS. 2A, 2B and 2C. The bias signal BIAS may be a current signal or a voltage signal.

The precharge switching transistor 200, in response to the feedback signal VG, controls a precharge current for precharging the bitline BL. The bitline BL may be electrically coupled to a sense amplifier 300 through the precharge switching transistor 200. The precharge current for precharging the bitline BL may be provided by the sense amplifier 300.

The bias signal generator 400 may be charged using the precharge current to provide the bias signal BIAS to the feedback circuit 100. The bias signal generator 400 may provide the bias voltage signal BIASV that is applied to the bias current source 102 of FIG. 2B and the bias current source 104 of FIG. 2C. If the bias signal BIAS is a bias current signal BIASI, the bias current source 102 of FIG. 2B and the bias current source 104 of FIG. 2C may be omitted and replaced by the bias signal generator 400. The bias signal generator 400 may be charged using the precharge current to obtain a target level of the bias voltage signal BIASV or the bias current signal BIASI. The bias signal generator 400 may be disposed adjacent to the feedback circuit 100. When a plurality of bitlines are precharged by a plurality of feedback circuits, respectively, all or portion of the bias signal generator 400 may be disposed adjacent to the feedback circuits to reduce mismatch caused by different paths for transferring the bias signal from the bias signal generator 400 to the respective feedback circuits.

Figure 5:
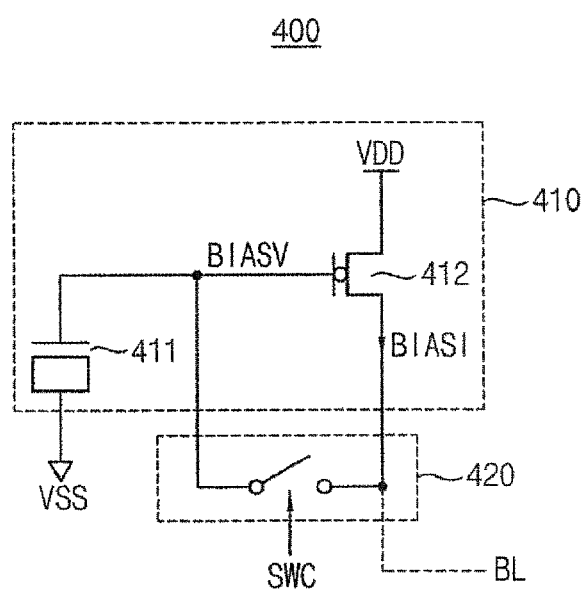
FIG. 5 is a circuit diagram illustrating an example of a bias signal generator in the non-volatile memory device of FIG. 4.

FIG. 5 is a circuit diagram illustrating an example of a bias signal generator in the non-volatile memory device of FIG. 4.

Referring to FIG. 5, the bias signal generator 400 of this example includes a charging unit 410 and a switch unit 420.

The charging unit 410 may be coupled to the bitline BL through the switch unit 420 to be charged using the precharge current. The charging unit 410 may generate the charged voltage, that is, a bias voltage signal BIASV, and generate a bias current signal BIASI based on the bias voltage signal BIASV. The bias voltage signal BIASV or the bias current signal BIASI may be provided to the feedback circuit 100 as the bias signal BIAS. The charging unit 410 may include a capacitor 411 and a transistor 412. For example, the capacitor may be a MOS capacitor that is implemented using a MOS transistor, in which the drain and source are electrically coupled. A gate of the MOS transistor may be coupled to a gate of the transistor 412 and the bitline BL through the switch unit 420. The transistor 412 may be a PMOS transistor coupled between a power supply voltage VDD and the switch unit 420. The transistor 412 may function as a current source that generates the bias current signal BIASI based on the bias voltage signal BIASV charged in the capacitor 411.

The switch unit 420 may control a current path between the charging unit 410 and the bitline BL in response to a switch control signal SWC. The switch unit 420 may control a path of the precharge current, and may include at least one transistor responding to the switch control signal SWC.

Figure 6A:
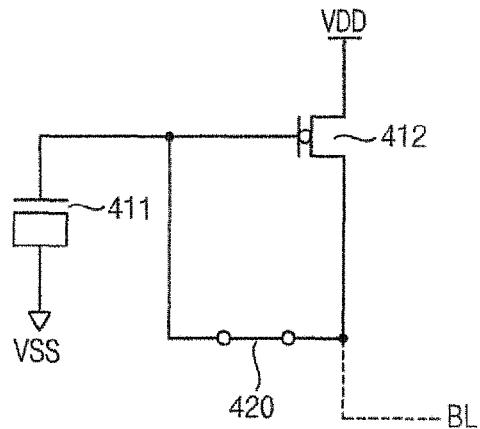
FIGS. 6A, 6B and 6C are diagrams for describing operations of the bias signal generator of FIG. 5.
Figure 6B:
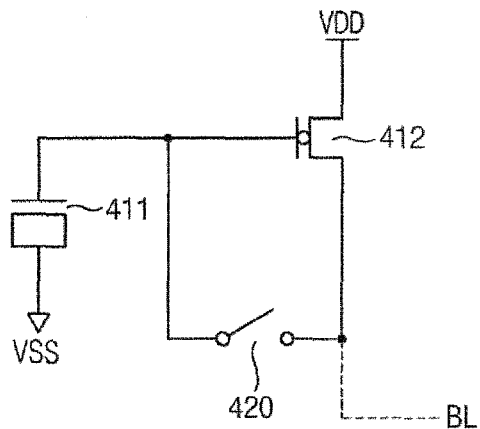
Figure 6C:
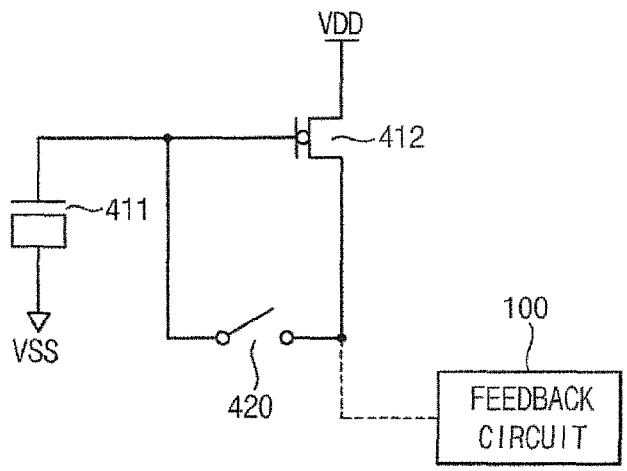

FIGS. 6A, 6B and 6C are diagrams for describing operations of the bias signal generator of FIG. 5.

FIG. 6A represents a capacitor precharge operation of a current copy mode, FIG. 6B represents a switching operation, and FIG. 6C represents a bias signal generation mode of the bias signal generator 400.

Referring to FIG. 6A, during the current copy mode, the switch unit 420 electrically connects the bitline BL and the capacitor 411 in the charging unit to charge the capacitor 411 using the precharge current for precharging the bitline BL.

Referring to FIG. 6B, when the capacitor 411 is charged to a target level of the bias voltage signal BIASV for generating the bias current signal BIASI, the switch unit 420 electrically disconnects the bitline BL from the capacitor 411 to maintain the charge in the capacitor 411, that is, the bias voltage signal BIASV. The bias voltage signal BIASV is applied to the gate of the transistor 412. The timing of the switching operation of the switch unit 420 may be determined so that the bias current signal BIASI may have a sufficiently small level, for example, a level of about several nA (nano Ampere). The bias current is required until the precharge operation is completed to detect the bitline voltage VS. Considering that a large number of bitlines are included in a non-volatile memory device, power consumption increases considerably as the bias current increases. Accordingly, the switch operation may be performed when the bitline BL is precharged to a sufficiently large voltage level and thus the bias current signal BIASI is sufficiently small.

Referring to FIG. 6C, the bias signal generator 400 provides the bias voltage signal BIASV charged and maintained in the capacitor 411 and/or the bias current signal BIASI corresponding to the bias voltage signal BIASV to the feedback circuit 100. After the switch operation of the switch unit 420, the charge that is precharged in the capacitor 411 may be reduced gradually due to a leakage current. Accordingly, the capacitor precharge operation of FIG. 6A and the switch operation of FIG. 6B may be periodically repeated in consideration of the leakage current level to update the bias voltage signal BIASV and the bias current signal BIASI.

In the bias signal generator 400, the switch unit 420 may be coupled directly between the bitline BL and the capacitor 411, or additional circuits may be added between the switch unit 420 and the bitline BL. The switch unit 420 may be coupled to the feedback circuit 100. For example, the switch unit 420 may be coupled to elements in the feedback circuit 100 to control the flow of current.

Figure 7A:
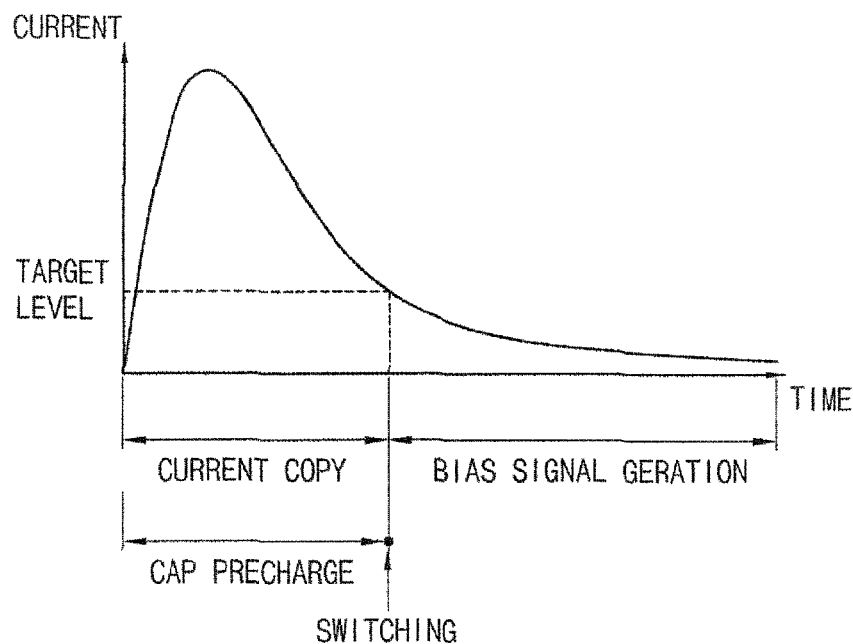
FIG. 7A is a diagram illustrating a precharge current flowing through a bitline during operation modes of the bias signal generator.

FIG. 7A is a diagram illustrating a precharge current flowing through a bitline during operation modes of the bias signal generator.

Referring to FIG. 7A, the precharge current flowing through the bitline increases rapidly during initial period of the precharge operation and decreases as the bitline is precharged. The switch operation of FIG. 6B may be performed when the bias voltage signal BIASV is charged to the target level. In other words, the switch operation of FIG. 6B may be performed when the bitline BL is precharged to a sufficiently large voltage level and thus the bias current signal BIASI is sufficiently small. As illustrated in FIG. 7A, the time period before the switching operation may be referred to as the current copy mode, and the time period after the switching operation may be referred to as the bias signal generation mode.

The bias signal generator 400 performs the capacitor precharge operation during the current copy mode. The switch unit 420 is turned on during the current copy mode to electrically connect the bitline BL and the capacitor 411. Charge is supplied to the capacitor 411 through a portion of the precharge current. When the bias voltage signal BIASV attains the target level for generating the bias current signal BIASI of sufficiently small level, the switching operation of FIG. 6B is performed. In other words, the switch unit 420 is turned off to electrically disconnect the capacitor 411 from the bitline BL. For example, the bias current signal BIASI corresponding to the target level of the bias voltage BIASV may have a level of about 200 nA.

During the bias signal generation mode, the bias current signal BIASI based on the maintained bias voltage signal BIASV is provided to the feedback circuit 100.

Figure 7B:
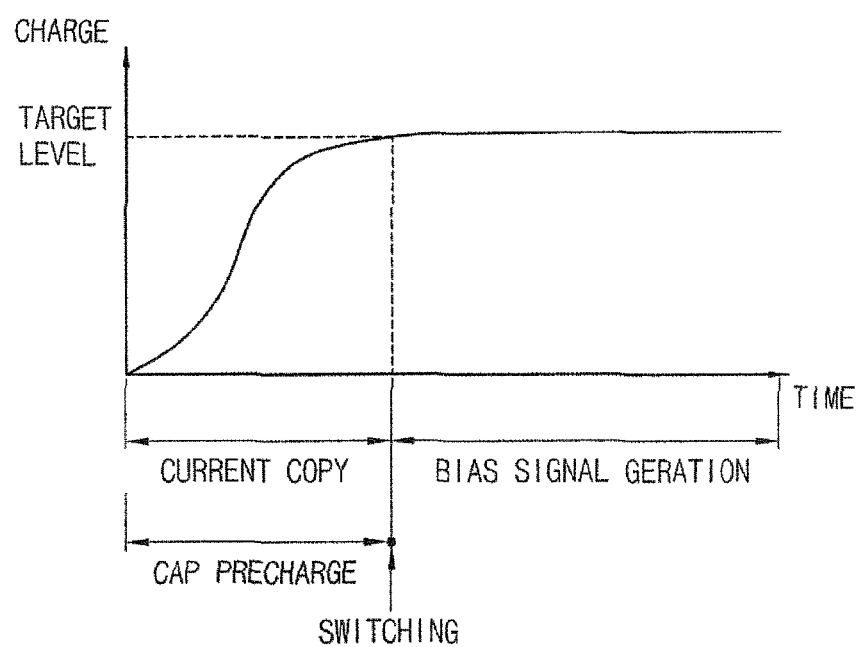
FIG. 7B is a diagram illustrating a charge of a bitline during operation modes of the bias signal generator.

FIG. 7B is a diagram illustrating a charge of a bitline during operation modes of the bias signal generator.

Referring to FIG. 7B, the charge in the capacitor 411, that is, the bias voltage signal BIASV increases gradually during the current copy mode. When the bias voltage signal BIASV attains the target level, the switching operation of FIG. 6B is performed and then the bias signal generator 400 provides the bias voltage signal BIASV and/or the bias current signal BIASI to the feedback circuit 100 during the bias signal generation mode.

Figure 8A:
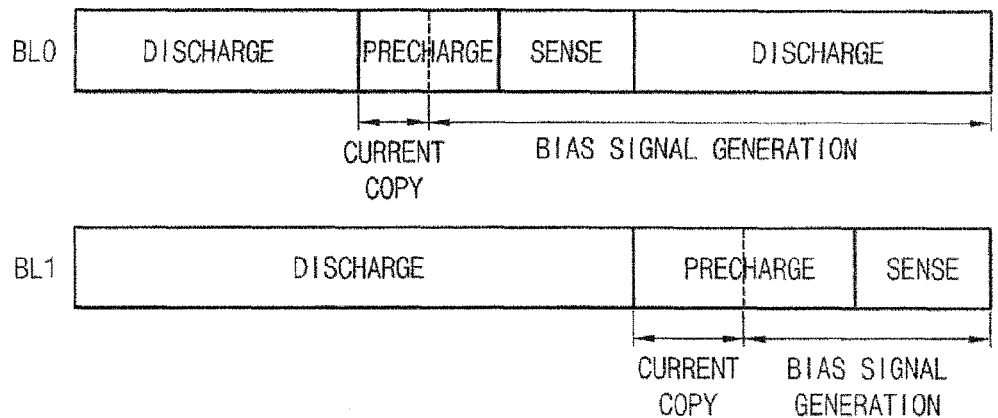
FIGS. 8A and 8B are diagrams illustrating timings of a current copy mode and a bias signal generation mode of the bias signal generator of FIG. 5.
Figure 8B:
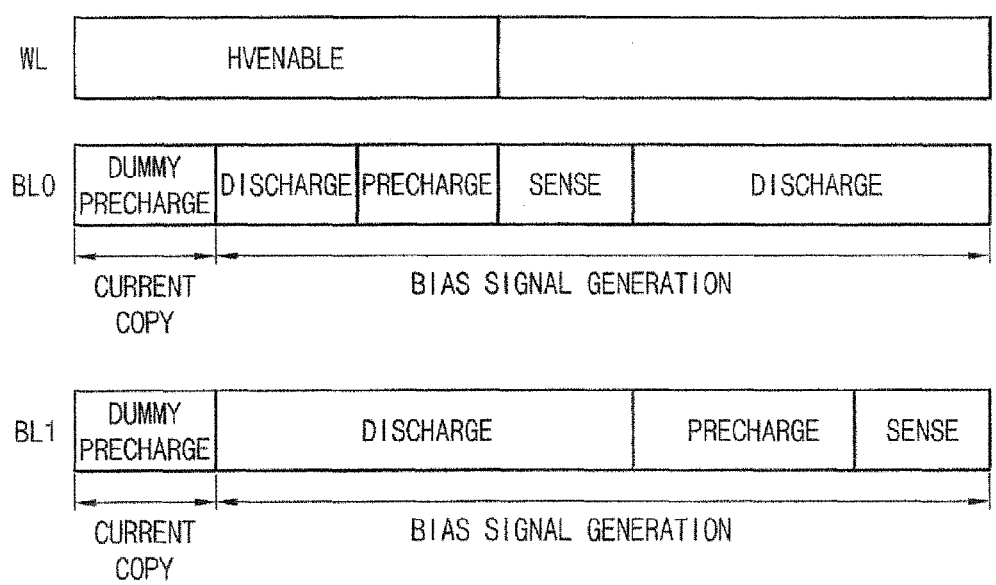

FIGS. 8A and 8B are diagrams illustrating timings of a current copy mode and a bias signal generation mode of the bias signal generator of FIG. 5.

FIG. 8A illustrates that the current copy mode is performed during the precharge operation. Referring to FIG. 8A, a read operation for detecting data stored in a memory cell coupled to a bitline may include a discharge operation, a precharge operation and a sense operation. For example, the non-volatile memory device may perform the discharge operation, the precharge operation and the sense operation with respect to a first bitline BL0 and a second bitline BL1 as illustrated in FIG. 8A. The current copy mode may be performed during the precharge operation of the read operation. As mentioned above, the current copy mode may be periodically repeated in consideration of the leakage current level, to thereby update the bias voltage signal BIASV and the bias current signal BIASI provided during the bias signal generation mode.

FIG. 8B illustrates that the current copy mode is performed during a dummy-precharge operation. Referring to FIG. 8B, the dummy-precharge operation, which is not related with the precharge operation for read data, may be additionally executed to perform the current copy mode. In general, a time period HVENABLE may be required in the non-volatile memory device to generate a high voltage applied to a wordline WL. The discharge operation and the precharge operation may be performed without the high voltage and thus may be performed during the time period HVENABLE. For example, the current copy mode may be performed during such time period HVENABLE as illustrated in FIG. 8B.

Figure 9:
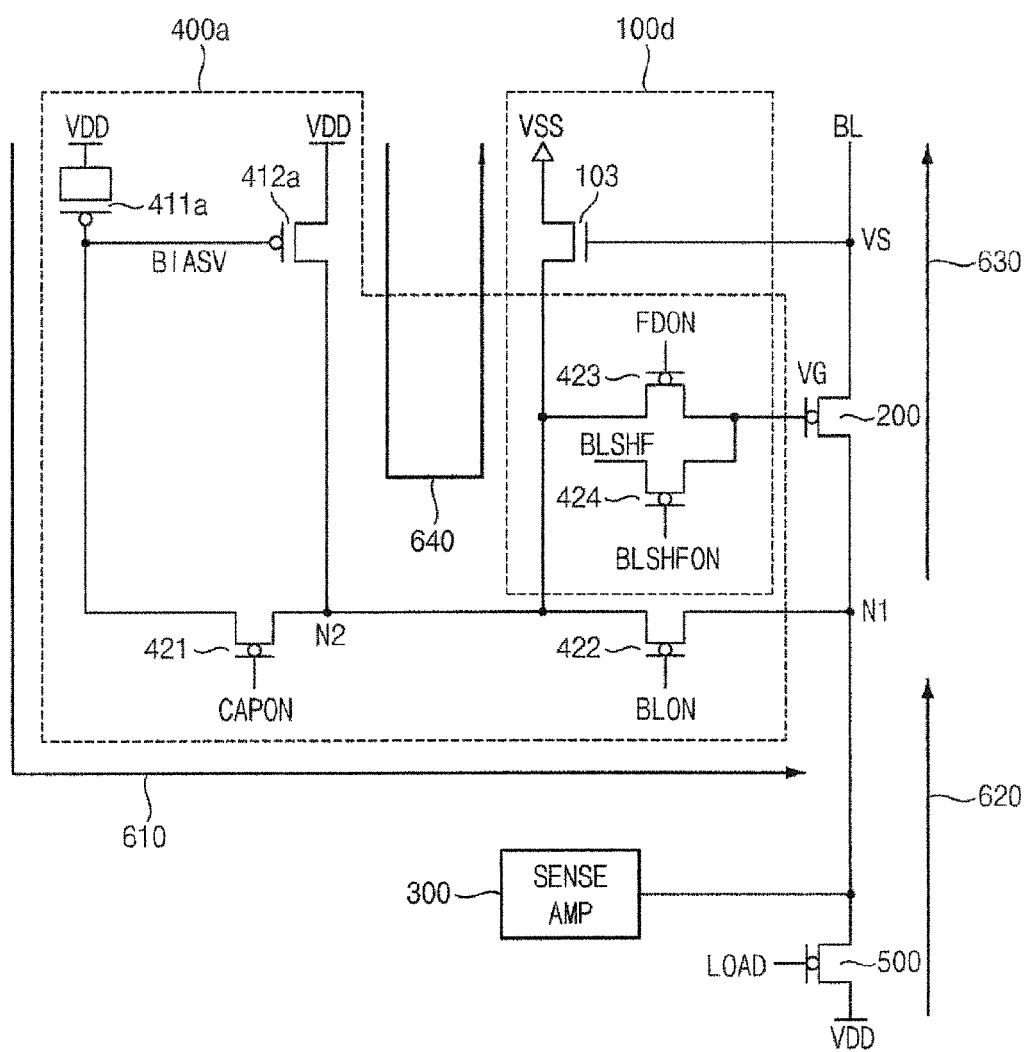
FIG. 9 is a circuit diagram illustrating a non-volatile memory device according to example embodiments.

FIG. 9 is a circuit diagram illustrating a non-volatile memory device according to example embodiments.

Referring to FIG. 9, a non-volatile memory device 1000e includes a feedback circuit 100d, a precharge switching transistor 200 and a bias signal generator 400a.

The feedback circuit 100d generates a feedback signal VG based on a voltage level VS of a bitline BL during a precharge operation. The precharge switching transistor 200, in response to the feedback signal VG, controls a precharge current for precharging the bitline BL. The feedback circuit 100d may be driven by a bias current signal 640. The bias signal generator 400a may be charged using the precharge current to provide the bias current signal 640 to the feedback circuit 100d.

The feedback circuit 100d may include a feedback transistor 103. In addition, the feedback circuit 100d may further include control elements 423 and 424 that may be shared with the bias signal generator 400a.

The feedback transistor 103 generates the feedback signal VG by inverting the voltage level VS of the bitline BL. The feedback transistor 103 may be an NMOS transistor that has a source receiving a ground voltage VSS, a drain outputting the feedback signal VG to a gate of the precharge switching transistor 200, and a gate receiving the bitline voltage VS.

The bias signal generator 400a may be charged using the precharge current to generate the bias current signal 640. That is, the bias signal generator 400a may function as a current source for providing a bias current to the feedback transistor 103. The bias signal generator 400a may be charged using the precharge current to obtain a target level of the bias voltage signal BIASV, and may generate the bias current signal 640 based on the charged bias voltage signal BIASV. The bias signal generator 400a may be disposed adjacent to the corresponding feedback circuit 100. When a plurality of bitlines are precharged by a plurality of feedback circuits, respectively, all or portion of the bias signal generator 400a may be disposed adjacent to the corresponding feedback circuit 100d to reduce mismatch caused by different paths for transferring the bias current signal 640 from the bias signal generator 400d to the corresponding feedback circuit 100d.

The bias signal generator may include a capacitor 411a, a current source transistor 412a, and first through fourth switches 421, 422, 423 and 424. For example, the capacitor 411a may be a MOS capacitor that is implemented using a PMOS transistor, in which the drain and source are electrically coupled as illustrated in FIG. 9. A gate of the MOS transistor 411a may be coupled to a gate of the current source transistor 412a and may be coupled to the bitline BL through the switch 421 and the second switch 422. The transistor 412a may be a PMOS transistor coupled between a power supply voltage VDD and a second node N2 between the first switch 421 and the second switch 422. The current source transistor 412a may function as a current source that generates the bias current signal 640 based on the bias voltage signal BIASV charged in the capacitor 411a.

The first through fourth switches 421, 422, 423 and 424 may be PMOS transistors that perform switching operations in response to first through fourth switch control signals CAPON, BLON, FDON and BLSHFON, respectively. The switch unit 420 of FIG. 5 may include the first through fourth switches 421, 422, 423 and 424, and the switch control signal SWC of FIG. 5 may include the first through fourth switch control signals CAPON, BLON, FDON and BLSHFON. The first switch 421 is coupled between the capacitor 411a and the second node 421, and the second switch 422 is coupled between the second node N2 and a first node N1. The third switch 423 is coupled between the drain of the feedback transistor 103 and the gate of the precharge switching transistor 200. The fourth switch 424 is coupled between the gate of the precharge switching transistor 200 and a dummy precharge voltage BLSHF. The first and second switches 421 and 422 control a current path between the capacitor 411a and the bitline BL in response to the first and second switch control signals CAPON and BLON. The third switch 423 controls a feedback current path between the feedback transistor 103 and the precharge switching transistor 200 in response to the third switch control signal FDON. The fourth switch 424 applies the dummy precharge voltage BLSHF in response to the fourth switch control signal BLHSFON to turn on the precharge switching transistor 200 for the dummy-precharge operation.

A precharge load transistor 500 functions as a current source for providing the precharge current to the first node N1 based on the power supply voltage VDD. The precharge load transistor 500 may be included in the sense amplifier 300.

Operations of the non-volatile memory device of FIG. 9 will be described next.

During the current copy mode, the precharge load transistor 500 is turned on to generate a source current 620, and the first switch 421 the second switch 422 are turned on to connect the current path between the capacitor 411a and the first node N1. In case of the precharge operation for reading out the data stored in the memory cell coupled to the bitline BL, the third switch 423 is turned on in response to the third switch control signal FDON so that the precharge current 620 may flow into the bitline through the precharge switching transistor 200. The current 610 from the capacitor 411a flows through the first and second switches 421 and 423, and the current 610 and the source current 620 are summed at the first node N1, and the summed precharge current 630 flows into the bitline BL through the precharge switching transistor 200.

As such, the capacitor 411a may be charged (or be discharged) through the current 610.

The current 610 and the bias current signal 640 decreases gradually as the bitline BL is precharged. When the bias voltage signal BIASV attains the target level, the first and second switches 421 and 422 are turned off to electrically disconnect the capacitor 411a from the first node N1, which corresponds to the switching operation of FIG. 6B. After the switching operation, the bias voltage signal BIASV is maintained and the transistor 412a provides the bias current signal 640 of a substantially constant level to the feedback transistor 103, which corresponds to the bias signal generation mode of FIG. 6C.

In case of the current copy mode of the dummy-precharge operation, the third switch 423 is turned off and the fourth switch 424 is turned on in response to the fourth switch control signal BLSHFON so that the dummy precharge voltage BLSHF may be applied to turn on the precharge switching transistor 200. When the dummy-precharge operation is completed, the third switch 423 is turned on and the fourth switch 424 is turned off to perform the normal read operation including the discharge operation, the precharge operation and the sense operation.

In the embodiment of FIG. 9, the bias signal generator 400a may include some elements pertaining to a shared circuit block that is shared by two or more feedback circuits, and other elements pertaining to an unshared circuit block that is dedicated to one corresponding feedback circuit. For example, the capacitor 411a, the first switch 421 and the second switch 422 may pertain to the shared circuit block, and the current source transistor 412a, the third switch 423 and the fourth switch 424 may pertain to the unshared circuit block.

Figure 10A:
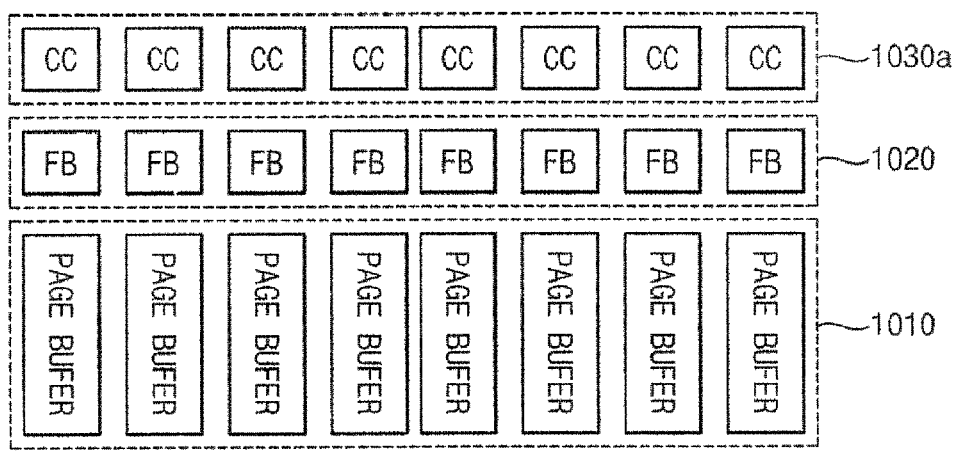
FIGS. 10A and 10B are diagrams illustrating layouts of a non-volatile memory device according to example embodiments.
Figure 10B:
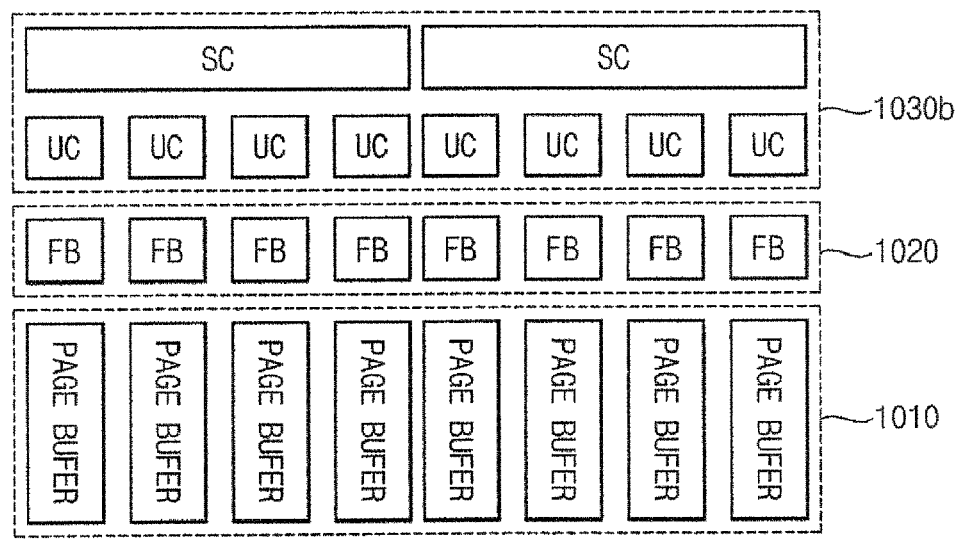

FIGS. 10A and 10B are diagrams illustrating layouts of a non-volatile memory device according to example embodiments.

Referring to FIGS. 10A and 10B, a non-volatile memory device includes a page buffer circuit 1010, a plurality 1020 of feedback circuits FB and a bias signal generator 1030a or 1030b.

The page buffer circuit includes a plurality of unit page buffers, and each page buffer may include each precharge switching transistor 200 as described above. The precharge switching transistors in the respective unit page buffers are coupled between a plurality of bitlines and a plurality of sense amplifiers, respectively. The precharge switching transistors, in response to feedback signals, control precharge currents for precharging the bitlines, respectively.

The feedback circuits FB may be driven based on bias signals to generate the feedback signals based on voltage levels of the bitlines, respectively, during a precharge operation.

The bias signal generator 1030a or 1030b may be charged using the precharge currents to provide the bias signals to the feedback circuits FB, respectively.

Referring to FIG. 10A, the bias signal generator 1030a may include a plurality of unit blocks CC, and each unit block CC may be dedicated to the corresponding page buffer FB. The unit block may have a configuration of the bias signal generator 400 of FIG. 5 or the bias signal generator 400a of FIG. 9.

Referring to FIG. 10B, the bias signal generator may include at least one shared circuit block SC and a plurality of unshared circuit blocks UC. Each shared circuit block is coupled to two or more of the feedback circuits and may be shared for providing the bias current signals to the coupled feedback circuits FB. As mentioned above, the capacitor 411a, the first switch 421 and the second switch 422 of FIG. 9 may pertain to the shared circuit block. Each unshared circuit block is coupled to and disposed adjacent to each of the feedback circuits FB. As mentioned above, the current source transistor 412a, the third switch 423 and the fourth switch 424 of FIG. 9 may pertain to the unshared circuit block.

Since all or portion of the bias signal generator 1030a or 1030b are disposed adjacent to the corresponding feedback circuits, mismatch cause by different paths for transferring the bias signal from the bias signal generator to the respective feedback circuits may be reduced.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A non-volatile memory device comprising:
    a feedback circuit configured to generate a feedback signal based on a voltage level of a bitline during a precharge operation, wherein the feedback circuit includes an active circuit configured to be driven based on a bias signal to generate the feedback signal based on the voltage level of the bitline;
    a precharge switching transistor configured to, in response to the feedback signal, control a precharge current for precharging the bitline; and
    a bias signal generator configured to be charged using the precharge current to provide the bias signal to the feedback circuit,
    wherein the bias signal generator includes:
        a charging unit configured to be charged using the precharge current to generate a bias voltage signal, and configured to generate a bias current signal based on the bias voltage signal; and
        a switch unit configured to control a current path between the charging unit and the bitline.

2. The non-volatile memory device of claim 1, wherein the bias signal generator is configured to generate the bias signal during at least one of the precharge operation and a dummy-precharge operation.

3. The non-volatile memory device of claim 1, wherein the bias signal generator is disposed adjacent to the feedback circuit.

4. The non-volatile memory device of claim 1, wherein the switch unit is configured to electrically connect the bitline and the charging unit to charge the charging unit and configured to electrically disconnect the bitline from the charging unit when the charging unit is charged to a target level of the bias voltage signal for generating the bias current signal.

5. The non-volatile memory device of claim 1, wherein the feedback circuit includes:
    an amplifier configured to be driven based on a bias current signal to generate the feedback signal by amplifying a difference between a precharge level signal and the voltage level of the bitline.

6. The non-volatile memory device of claim 1, wherein the active circuit includes:
   a feedback transistor configured to be driven based on a bias current signal to generate the feedback signal in response to the voltage level of the bitline.

7. The non-volatile memory device of claim 1, wherein the active circuit includes:
   a differential amplifier configured to be driven based on a bias current signal to generate the feedback signal by comparing a precharge level signal and the voltage level of the bitline.

* * * * *